United States Patent
Furukawa et al.

(10) Patent No.: US 8,185,336 B2
(45) Date of Patent: May 22, 2012

(54) TEST APPARATUS, TEST METHOD, PROGRAM, AND RECORDING MEDIUM REDUCING THE INFLUENCE OF VARIATIONS

(75) Inventors: Yasuo Furukawa, Saitama (JP); Goerschwin Fey, Bremen (JP); Satoshi Komatsu, Tokyo (JP); Masahiro Fujita, Tokyo (JP)

(73) Assignees: Advantest Corporation, Tokyo (JP); The University of Tokyo, Tokyo (JP)

( * ) Notice: Subject to any disclaimer, the term of this patent is extended or adjusted under 35 U.S.C. 154(b) by 738 days.

(21) Appl. No.: 12/261,062

(22) Filed: Oct. 30, 2008

(65) Prior Publication Data

US 2010/0114520 A1    May 6, 2010

(51) Int. Cl.
- *G01R 31/00* (2006.01)
- *G01R 31/14* (2006.01)
- *G01R 31/28* (2006.01)

(52) U.S. Cl. ........ 702/118; 702/117; 702/120; 714/724; 714/738; 714/741

(58) Field of Classification Search ........... 702/117, 702/118, 120; 714/724, 738, 741
See application file for complete search history.

(56) References Cited

U.S. PATENT DOCUMENTS

| | | | |
|---|---|---|---|
| 5,592,493 A * | 1/1997 | Crouch et al. | 714/729 |
| 5,757,816 A * | 5/1998 | Al-Assadi et al. | 714/718 |
| 6,889,164 B2 * | 5/2005 | Okuda | 702/183 |
| 6,975,978 B1 * | 12/2005 | Ishida et al. | 703/15 |
| 2005/0125711 A1 * | 6/2005 | Gattiker et al. | 714/47 |

OTHER PUBLICATIONS

Article titled "IDDX-Based Test Methods: A Survey", authored by Sabade, et al., adopted from ACM Transactions on Design Automation of Electronic Systems, vol. 9, No. 2, Apr. 2004, pp. 159-198.
Article titled "Leakage Current Mechanisms and Leakage Reduction Techniques in Deep-Submicrometer CMOS Circuits", authored by Roy, et al., adopted from Proceedings of the IEEE, vol. 91, No. 2, Feb. 2003, pp. 305-327.

* cited by examiner

*Primary Examiner* — Janet Suglo
(74) *Attorney, Agent, or Firm* — Jianq Chyun IP Office

(57) ABSTRACT

Provided is a test apparatus that tests a device under test, including a vector expanding section that sequentially generates a plurality of test vectors; a predicting section that calculates a predicted value for each test vector by simulating an operation of the device under test, the predicted value indicating a prescribed characteristic value of the device under test to be measured while the device under test is supplied with a test signal corresponding to the test vector; a measuring section that obtains a measured value for each test vector by measuring the prescribed characteristic value of the device under test each time the device under test is supplied with a test vector; and a judging section that judges whether the device under test is defective based on a ratio between the predicted value and the measured value corresponding to each test vector.

8 Claims, 10 Drawing Sheets

| TEST VECTOR | PREDICTED VALUE | NORMALIZED PREDICTED VALUE $A(k)$ | MEASURED VALUE | NORMALIZED MEASURED VALUE $B(k)$ | $B(k)/A(k)$ |
|---|---|---|---|---|---|
| Vector 0 | 450 μA | 1.000 | 465 μA | 1.000 | 1.000 |
| Vector 1 | 495 μA | 1.100 | 510 μA | 1.097 | 0.997 |
| Vector 2 | 470 μA | 1.044 | 490 μA | 1.054 | 1.010 |
| Vector 3 | 420 μA | 0.933 | 435 μA | 0.935 | 1.002 |
| Vector 4 | 455 μA | 1.011 | 510 μA | 1.097 | 1.085 |
| ... | ... | ... | ... | ... | ... |
| Vector i | | | | | |

FIG.3

| TEST VECTOR | PREDICTED VALUE | NORMALIZED PREDICTED VALUE A(k) | $\alpha(k) = \frac{A(k)}{A(k-1)}$ | MEASURED VALUE | NORMALIZED MEASURED VALUE B(k) | $\beta(k) = \frac{B(k)}{B(k-1)}$ | $\beta(k)/\alpha(k)$ |
|---|---|---|---|---|---|---|---|
| Vector 0 | 450 μA | 1.000 | — | 465 μA | 1.000 | — | — |
| Vector 1 | 495 μA | 1.100 | 1.100 | 510 μA | 1.097 | 1.097 | 0.997 |
| Vector 2 | 470 μA | 1.044 | 0.949 | 490 μA | 1.054 | 0.961 | 1.013 |
| Vector 3 | 420 μA | 0.933 | 0.894 | 435 μA | 0.935 | 0.887 | 0.992 |
| Vector 4 | 455 μA | 1.011 | 1.084 | 510 μA | 1.097 | 1.173 | 1.082 |
| ... | ... | ... | ... | ... | ... | ... | ... |
| Vector i−1 | 480 μA | 1.067 | *** | 530 μA | 1.140 | *** | *** |
| Vector i | 490 μA | 1.089 | 1.021 | 545 μA | 1.172 | 1.028 | 1.007 |
| Vector i+1 | 470 μA | 1.044 | 0.959 | 520 μA | 1.145 | 0.977 | 1.019 |
| ... | ... | ... | ... | ... | ... | ... | ... |

| state | AND | OR |
|---|---|---|
| 00 | 8pA | 16pA |
| 01 | 11pA | 13pA |
| 10 | 13pA | 11pA |
| 11 | 16pA | 9pA |

TEST APPARATUS, TEST METHOD, PROGRAM, AND RECORDING MEDIUM REDUCING THE INFLUENCE OF VARIATIONS

BACKGROUND

1. Technical Field

The present invention relates to a test apparatus, a test method, a program, and a recording medium. In particular, the present invention relates to a test apparatus that tests a device under test such as a semiconductor circuit.

2. Related Art

A conventional method for testing a device under test such as a semiconductor circuit involves measuring a characteristic of the device under test while a logic circuit of the device under test operates according to a prescribed logic pattern. If the device under test includes a CMOS circuit, the device under test is tested by measuring the quiescent current IDDQ or the transient current IDDT flowing to the device under test while changing the logic pattern applied to the CMOS circuit, as in, for example, "IDDX-Based Test Methods: A Survey," SAGAR S. SABADE and DUNCAN M. WALKER, ACM Transactions on Design Automation of Electronic Systems, Vol. 9, No. 2, April 2004, Pages 159-198, and "Leakage Current Mechanisms and Leakage Reduction Techniques in Deep-Submicrometer CMOS Circuits," KAUSHIK ROY, SAIBAL MUKHOPADHYAY, and HAMID MAHMOODI-MEIMAND, Proceedings of the IEEE, Vol. 91, No. 2, February 2003, Pages 305-327.

Since one of a pair of transistors in the gate is turned off, the current flowing from the H power supply line to the L power supply line via the CMOS circuit is extremely small. If these transistors are defective, a relatively large leak current might flow through the CMOS circuit depending on the logic state of the CMOS circuit.

This leak current can be detected by observing the quiescent current IDDQ flowing to the device under test. The defective portion of the device under test can be estimated by analyzing test vectors applied to the device under test while a relatively large leak current flows to the device under test.

A certain fluctuation of the quiescent current IDDQ is expected. But if the fluctuation of the quiescent current IDDQ exceeds a prescribed value, the device is considered defective.

Since measuring the quiescent current IDDQ involves detecting the current corresponding to the leak current of the CMOS circuit, it is necessary to measure a very small current with a high degree of accuracy. However, the quiescent current IDDQ flowing to the device under test might change depending on the test vectors.

FIG. 10A shows an exemplary circuit in a device under test 312. The device under test 312 uses CMOS circuits for each of a 2-input AND gate 302, a 2-input OR gate 304, and a 2-input OR gate 306 included therein. The AND gate 302 outputs an AND of an input bit i2 and an input bit i3. The OR gate 304 outputs an OR of the input bit i1 and an output bit of the AND gate 302. The OR gate 306 outputs an OR of an input bit i3 and an input bit i4.

FIG. 10B is a table showing the leak current in the non-defective AND gate 302, OR gate 304, and OR gate 306, for each input logic state. For example, when the device under test 312 is supplied with the input bits {i1, i2, i3, i4}={0, 1, 1, 0}, the leak current of the AND gate 302 is 16 pA, the leak current of the OR gate 304 is 13 pA, and the leak current of the OR gate 306 is 11 pA. Therefore, the leak current of the device under test 312 is 16 pA+13 pA+11 pA=40 pA.

On the other hand, when the device under test 312 is supplied with the input bits {i1, i2, i3, i4}={1, 0, 0, 1}, the leak current of the AND gate 302 is 8 pA, the leak current of the OR gate 304 is 11 pA, and the leak current of the OR gate 306 is 13 pA. Therefore, the leak current of the device under test 312 is 8 pA+11 pA+13 pA=32 pA.

In this way, the leak current in the device under test 312 changes according to the pattern of the input bits. When the leak current changes depending on the input pattern, it becomes difficult to accurately detect the fluctuation of the leak current caused by a defect. Therefore, pass/fail of the device under test 312 cannot be accurately judged.

SUMMARY

Therefore, it is an object of an aspect of the innovations herein to provide a test apparatus, a test method, a program, and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a device under test, including a vector expanding section that sequentially generates a plurality of test vectors; a predicting section that calculates a predicted value for each test vector by simulating an operation of the device under test, the predicted value indicating a prescribed characteristic value of the device under test to be measured while the device under test is supplied with a test signal corresponding to the test vector; a measuring section that obtains a measured value for each test vector by measuring the prescribed characteristic value of the device under test each time the device under test is supplied with a test vector; and a judging section that judges whether the device under test is defective based on a ratio between the predicted value and the measured value corresponding to each test vector.

According to a second aspect related to the innovations herein, one exemplary test method may include a method for testing a device under test, including the steps of sequentially generating a plurality of test vectors; calculating a predicted value for each test vector by simulating the operation of the device under test, the predicted value indicating a prescribed characteristic value of the device under test to be measured while the device under test is supplied with a test signal corresponding to the test vector; obtaining a measured value for each test vector by measuring the prescribed characteristic value of the device under test each time the device under test is supplied with a test vector; and judging whether the device under test is defective based on (i) normalized predicted values obtained by dividing each predicted value by a predicted value corresponding to a reference test vector and (ii) normalized measured values obtained by dividing each measured value by a measured value corresponding to the reference vector.

According to a third aspect related to the innovations herein, one exemplary program may include a program that causes a test apparatus to test a device under test, the program causing the test apparatus to function as: a vector expanding section that sequentially generates a plurality of test vectors; a predicting section that calculates a predicted value for each test vector by simulating the operation of the device under test, the predicted value indicating a prescribed characteristic value of the device under test to be measured while the device under test is supplied with a test signal corresponding to the test vector; a measuring section that obtains a measured value for each test vector by measuring the prescribed characteristic value of the device under test each time the device under test is supplied with a test vector; and a judging section that judges whether the device under test is defective based on (i) normalized predicted values obtained by dividing each predicted value by a predicted value corresponding to a reference test vector and (ii) normalized measured values obtained by dividing each measured value by a measured value corresponding to the reference vector.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows examples of predicted values calculated by the predicting section 22 and measured values obtained by the measuring section 60.

FIG. 5 shows another exemplary operation of the test apparatus 100.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
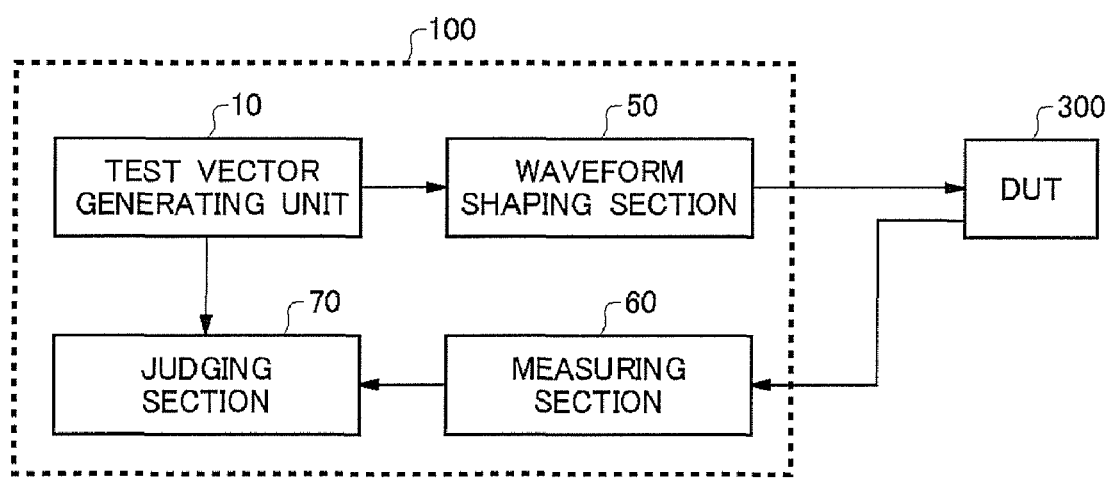
FIG. 1 shows an exemplary configuration of a test apparatus 100 according to an embodiment of the present invention.

FIG. 1 shows an exemplary configuration of a test apparatus 100 according to an embodiment of the present invention. The test apparatus 100 tests a device under test 300 such as a semiconductor circuit, and is provided with a test vector generating unit 10, a waveform shaping section 50, a measuring section 60, and a judging section 70.

The test apparatus 100 supplies the device under test 300 with a test signal having a prescribed pattern to test the device under test 300. For example, the test apparatus 100 judges pass/fail of the device under test 300 by measuring a prescribed characteristic of the device under test 300 supplied with the test signal. The test apparatus 100 may generate a test signal that causes a circuit block in the device under test 300 to operate.

The test apparatus 100 may measure the quiescent current IDDQ of the device under test 300 when the device under test 300 is inactive after being supplied with the test signal. In this case, the device under test 300 may be a semiconductor circuit that includes a plurality of CMOS circuits operating in accordance with the supplied test signal.

The test apparatus 100 can measure the quiescent current IDDQ for each state of the circuit block in the device under test 300 by sequentially supplying the device under test 300 with test signals having different logic patterns. The test apparatus 100 may analyze the defective portion of the device under test 300 based on the logic pattern of the test signal being supplied when the quiescent current IDDQ has an abnormal value.

The characteristic of the device under test 300 measured by the test apparatus 100 is not limited to the quiescent current IDDQ. The test apparatus 100 may measure any characteristic of the device under test 300 having a value that changes in accordance with the logic pattern of the test signal. This characteristic of the device under test 300 may be a voltage value, a current value, a voltage waveform, a current waveform, noise, or the like of power or of a signal input to or output from the device under test 300. The test apparatus 100 may measure the characteristic of an internal element of the device under test 300. For example, the test apparatus 100 measures the characteristic of a threshold voltage or the like of a transistor in the device under test 300.

The test vector generating unit 10 sequentially generates test vectors indicating a desired logic pattern of each test signal. For example, the test vector generating unit 10 generates test vectors having a plurality of bits corresponding to a plurality of pins under test of the device under test 300.

The waveform shaping section 50 sequentially generates test signals corresponding to the test vectors generated by the test vector generating unit 10. For example, the waveform shaping section 50 generates test signals having waveforms corresponding to the logic patterns of the test vectors. The waveform shaping section 50 may supply each pin under test of the device under test 300 with a signal according to the corresponding bit value of the test vector.

The measuring section 60 measures the prescribed characteristic of the device under test 300 being supplied with the test signals. For example, the measuring section 60 sequentially measures the quiescent current IDDQ of the device under test 300 during the supply of each test signal.

The judging section 70 judges pass/fail of the device under test 300 based on the values measured by the measuring section 60. For example, the judging section 70 measures pass/fail of the device under test 300 based on the variance of the values measured by the measuring section 60.

The judging section 70 may judge whether each value of the quiescent current IDDQ measured by the measuring section 60 is within a prescribed selection range. If one of the values of the quiescent current IDDQ is outside of the prescribed selection range, the judging section 70 may analyze the defective portion of the device under test 300 based on the test vector corresponding to the aforementioned value.

If different test signals are supplied to the device under test 300 in succession, the judging section 70 may judge whether the fluctuation amount of the quiescent current IDDQ measured by the measuring section 60 is within the prescribed selection range. If this fluctuation amount is outside of the prescribed selection range, the judging section 70 may analyze the defective portion of the device under test 300 by comparing the test vectors before and after the fluctuation of the quiescent current IDDQ.

The device under test 300 can be tested using the configuration described above. If the value of the characteristic measured by the measuring section 60 fluctuates according to the logic pattern of the test vector and is unrelated to the pass/fail of an internal circuit of the device under test 300, it might be impossible to determine whether the fluctuation of the measured value is caused by a defect in the device under test 300 or caused by the logic patterns of the test vectors.

The test apparatus 100 of the present embodiment calculates characteristic values that represent the predicted measurement values for each test vector by simulating the operation of a non-defective device under test 300 when each test vector is applied. In this way, the dependence of the characteristic values of the device under test 300 on the test vectors can be obtained. The test apparatus 100 can decrease the dependency of the measurement result on the test vectors by comparing the predicted value and the actual measured value of each test vector.

Figure 2:
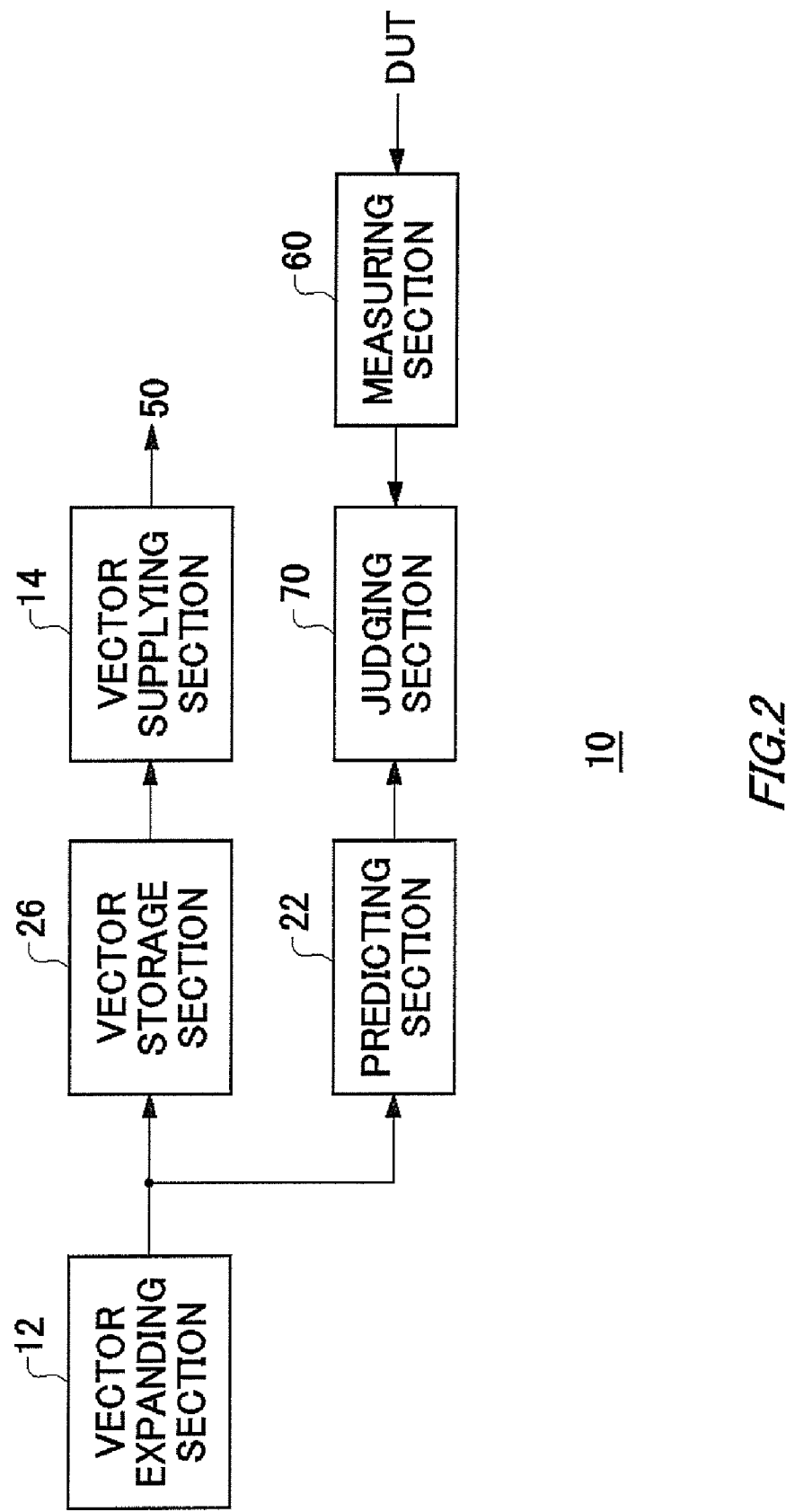
FIG. 2 shows an exemplary configuration of the test vector generating unit 10.

FIG. 2 shows an exemplary configuration of the test vector generating unit 10. The test vector generating unit 10 is provided with a vector expanding section 12, a vector storage section 26, a predicting section 22, and a vector supplying section 14.

The vector expanding section 12 sequentially generates the test vectors having different logic patterns. For example, the vector expanding section 12 sequentially generates the test vectors according to an algorithm supplied in advance.

The predicting section 22 calculates, for each test vector, the prescribed characteristic value of the device under test 300 that is predicted to be measured when the device under test 300 is supplied with the test signal corresponding to the test vector. The predicting section 22 may calculate the predicted values of the characteristic values for each test vector by simulating the operation of the device under test 300 when the test vector is applied.

Figures 10A, 10B:
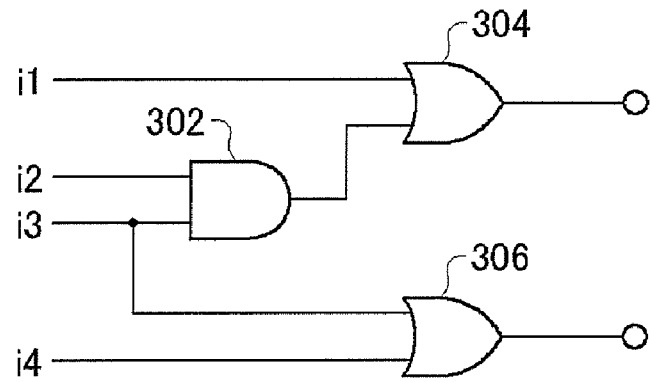
FIG. 10A shows an exemplary circuit in a device under test 312.
FIG. 10B is a table showing the leak current in non-defective AND gate 302, OR gate 304, and OR gate 306, for each input logic state.

The predicting section 22 may be provided in advance with circuit information of the device under test 300. For example, the predicting section 22 may be supplied in advance with circuit information that associates the operational state with the leak current for each circuit element of the device under test 300, as shown in FIG. 10B. The predicting section 22 may calculate the quiescent current for each test vector by simulating the operation of the device under test 300 based on the circuit information and the pattern of the supplied test vectors.

The vector storage section 26 stores therein the test vectors generated by the vector expanding section 12. The predicting section 22 may store the vector numbers, which are used to identify the test vectors generated by the vector expanding section 12, in association with the predicted values calculated for the test vectors.

The vector supplying section 14 sequentially reads the test vectors stored in the vector storage section 26 and supplies the read test vectors to the waveform shaping section 50. The vector supplying section 14 may read the test vectors in the order indicated by the vector numbers and supply the test vectors to the waveform shaping section 50 in the same order.

By this operation, the waveform shaping section 50 supplies the device under test 300 with test signals corresponding to the test vectors. The measuring section 60 measures the prescribed characteristic value of the device under test 300 for each test vector. The following describes an example in which the measuring section 60 acquires a measured value of the quiescent current IDDQ of the device under test 300 for each test vector.

The judging section 70 judges whether the device under test 300 is defective based on the ratio between the predicted value calculated by the predicting section 22 and the measured value obtained by the measuring section 60, for each test vector. By comparing each measured value to the predicted value derived from the pattern of the corresponding vector in this way, the effect of the pattern of each test vector on the measurement result can be decreased. Therefore, the test vector generating unit 10 can accurately detect abnormal values of the quiescent current IDDQ caused by a defect in the device under test 300.

FIG. 3 shows examples of predicted values calculated by the predicting section 22 and measured values obtained by the measuring section 60. The predicting section 22 calculates a predicted value indicating a characteristic value to be measured for each test vector. The predicting section 22 simulates the ideal operation of the device under test 300. Therefore, the variation of the predicted values for the test vectors corresponds to the variation caused by the difference between the test patterns, and is unaffected by whether or not the device under test 300 is defective.

The measuring section 60 acquires an actual measured value of the characteristic value of the device under test 300 each time the device under test 300 is supplied with a test vector. The variation of the measured value for each test vector includes a component caused by the pattern of the test vector, which is unaffected by the presence of a defect in the device under test 300, and a component that is caused by a defect in the device under test 300. Therefore, even when the a relatively large quiescent current IDDQ flows through the device under test 300, as shown by vectors 1 and 4, it is difficult to distinguish whether the current variation is caused by a defect in the device under test 300 or by the pattern of the test vector.

In response to this problem, the judging section 70 of the present embodiment judges whether the device under test 300 is defective based on the ratio between the predicted value and the measured value, for each test vector. For example, applying test vector 1 to the device under test 300 results in a predicted value of 495 μA and a measured value of 510 μA, as shown in FIG. 3. Applying test vector 4 to the device under test 300 results in a predicted value of 455 μA and a measured value of 510 μA, which shows a greater difference between the predicted value and the measured value.

The large measured value obtained when test vector 4 is applied to the device under test 300 indicates that the variation is caused by a defect in the device under test 300. On the other hand, the large measured value obtained when test vector 1 is applied to the device under test 300 indicates that the variation is caused by the pattern of test vector 1. In this way, the test apparatus 100 can accurately test the device under test 300.

The predicting section 22 may calculate a normalized predicted value by dividing each predicted value by a predicted value corresponding to a reference test vector. Using the example of FIG. 3, the predicting section 22 may set test vector 0 as the reference test vector and calculate the normalized predicted value by dividing the predicted values corresponding to the test vectors by 450 μA, which is the predicted value of the test vector 0.

In the same manner, the measuring section 60 may calculate a normalized measured value by dividing each measured value by a measured value corresponding to a reference test vector. The predicting section 22 and the measuring section 60 desirably use the same test vector as the reference test vector. The measuring section 60 of the present embodiment calculates the normalized measured value by dividing the measured values corresponding to the test vectors by 465 μA, which is the measured value of the test vector 0.

The judging section 70 judges whether the device under test 300 is defective based on the ratio between the normalized predicted value and the normalized measured value corresponding to each test vector. By this process, the deviation of the characteristic value of each test vector from a reference characteristic value corresponding to a prescribed test vector can be obtained. Even if a an error occurs in each measured value in the sequence, these errors are cancelled out by the error component included in the reference measured value because each measured value is divided by the reference measured value, The judging section 70 may judge whether the device under test 300 is defective based on whether the ratio between the normalized measured value and the normalized predicted value is greater than a prescribed reference value for each test vector. If the reference value is set to 1.05, for example, the ratio between the normalized measured value and the normalized predicted value of vector 4 is greater than the prescribed reference value, and therefore it is understood that an abnormal quiescent current IDDQ flows thorough the device under test 300 when test vector 4 is applied.

The predicting section 22 and the measuring section 60 may select the test vector having a predicted value closest to the preset reference value to be the reference vector. The predicting section 22 and the measuring section 60 may instead use a test vector that has been determined in advance to cause the device under test 300 to operate normally to be the reference test vector. As yet another example, the predicting section 22 and the measuring section 60 may select the test vector having a predicted value closest to an average of a plurality of predicted values to be the reference test vector.

Figure 4:
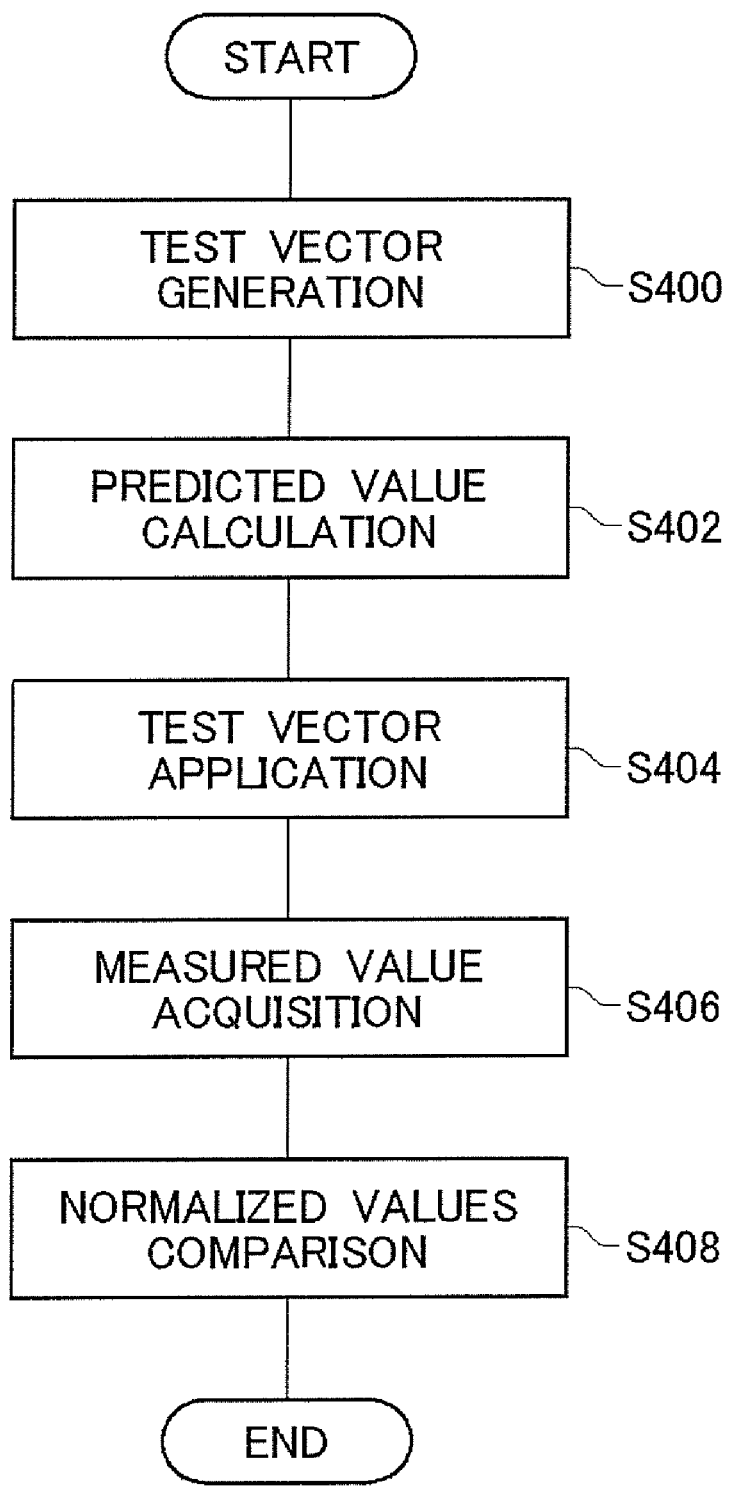
FIG. 4 is a flow chart describing an exemplary operation of the test apparatus 100 described in FIGS. 1 to 3.

FIG. 4 is a flow chart describing an exemplary operation of the test apparatus 100 described in FIGS. 1 to 3. As described above, the test vector expanding section 12 sequentially generates the test vectors to be applied to the device under test 300 (S400).

The predicting section 22 calculates a predicted value for each test vector (S402). The waveform shaping section 50 sequentially applies the test signals corresponding to the test vectors to the device under test 300 (S404). The measuring section 60 acquires the measured value for each test signal (S406). The process of S402 may be performed simultaneously with the processes of either S404 or S406, or may be performed in advance before the process of S404.

The judging section 70 judges whether the device under test 300 is defective by comparing the normalized predicted value and the normalized measured value for each test vector (S408). The processes described above decrease the effect of the variation of the measured values that depend on the pattern of the test vector, so that the defectiveness of the device under test 300 can be accurately judged.

FIG. 5 shows another exemplary operation of the test apparatus 100. In the present embodiment, the reference test vector is test vector 0, and test vectors 0, 1, 2, . . . , i−1, i, i+1, . . . are sequentially applied to the device under test 300.

The predicting section 22 calculates prediction variation values $\alpha(k)$, each indicating a variation between (i) a normalized predicted value $A(k)$ corresponding to one of the test vectors (k) and (ii) a normalized predicted value $A(k-1)$ corresponding to a test vector (k−1) supplied to the device under test 300 immediately prior to the test vector (k). The predicting section 22 of the present embodiment calculates the ratio between the normalized predicted value $A(k)$ and the normalized predicted value $A(k-1)$ as the prediction variation value $\alpha(k)$ for each test vector (k).

The measuring section 60 calculates measurement variation values $\beta(k)$, each indicating a variation between (i) a normalized measured value $B(k)$ corresponding to one of the test vectors (k) and (ii) a normalized measured value $B(k-1)$ corresponding to a test vector (k−1) supplied to the device under test 300 immediately prior to the test vector (k). The measuring section 60 of the present embodiment calculates the ratio between the normalized measured value $B(k)$ and the normalized measured value $B(k-1)$ as the measurement variation value $\beta(k)$ for each test vector (k).

The judging section 70 judges whether the device under test 300 is defective based on the ratio between the prediction variation value $\alpha(k)$ and the measurement variation value $\beta(k)$ corresponding to each test vector (k). For example, the judging section 70 may judge whether the device under test 300 is defective based on whether the ratio between the prediction variation value $\alpha(k)$ and the measurement variation value $\beta(k)$ is greater than a prescribed value.

Even if there is variation in the quiescent current IDDQ or the like caused by a variation in the temperature of the device under test 300 during testing, the process described above decreases the variation in the measurement result. For example, if the temperature of the device under test 300 increases due to circuit operation during the test, the measured value of the quiescent current IDDQ might be large even though the device under test 300 has no defects, as illustrated by test vectors (i−1), i, and (i+1) in FIG. 5. In this case, when comparing the predicted value and the measured value of each test vector, the judgment is made that the operation of the device under test 300 is abnormal even though the device under test 300 is actually operating normally in response to the vectors (i−1), i, (i+1), and the like.

To solve this problem, the judging section 70 of the present embodiment judges the acceptability of the operation of the device under test 300 for each vector based on the prediction variation value $\alpha(k)$ and the measurement variation value $\beta(k)$. Since the time intervals between the applications of the test vectors are generally short, there is only a small variation in the temperature of the device under test 300 between the application of each test vector in series. Therefore, the effect of the temperature variation on the measurement result can be decreased by comparing the variation of the predicted value and the variation of the measured value between the test vectors in the series.

For example, the quiescent current IDDQ measured for the test vector (i+1) is 520 μA, which is approximately 10% greater than the predicted value of 470 μA. Therefore, when the measured value and the predicted value are directly compared, the judgment is made that the operation of the device under test 300 is abnormal when the test vector (i+1) is applied. But since the judging section 70 of the present embodiment compares the variation amounts $\alpha(i+1)$ and $\beta(i+1)$ from the predicted value and the measured value of the immediately prior test vector (i), even if the quiescent current IDDQ steadily increases due to a temperature variation, the effect of this temperature variation and can be lowered so that the defectiveness of the device under test 300 can be accurately judged.

When a test vector (k) applied to the device under test 300 results in a large measured value of the quiescent current IDDQ due to a defect or the like in the device under test 300, the measurement variation value $\beta(k+1)$ of the immediately subsequent test vector (k+1) becomes small. In this case, the judging section 70 may judge that the operation of the device under test 300 is normal when the test vector (k+1) is applied.

The judging section 70 may calculate the prediction variation value and the measurement variation value between the test vector (k+1) and the test vector (k−1) two test vectors prior. If both (i) the ratio of the prediction variation value and the measurement variation value between the test vector (k+1) and the immediately prior test vector (k) and (ii) the ratio of the prediction variation value and the measurement variation value between the test vector (k+1) and the test vector (k−1) two test vectors prior are not within a prescribed range, the judging section 70 may judge that the operation of the device under test 300 is abnormal when the test vector (k+1) is applied.

Figure 6:
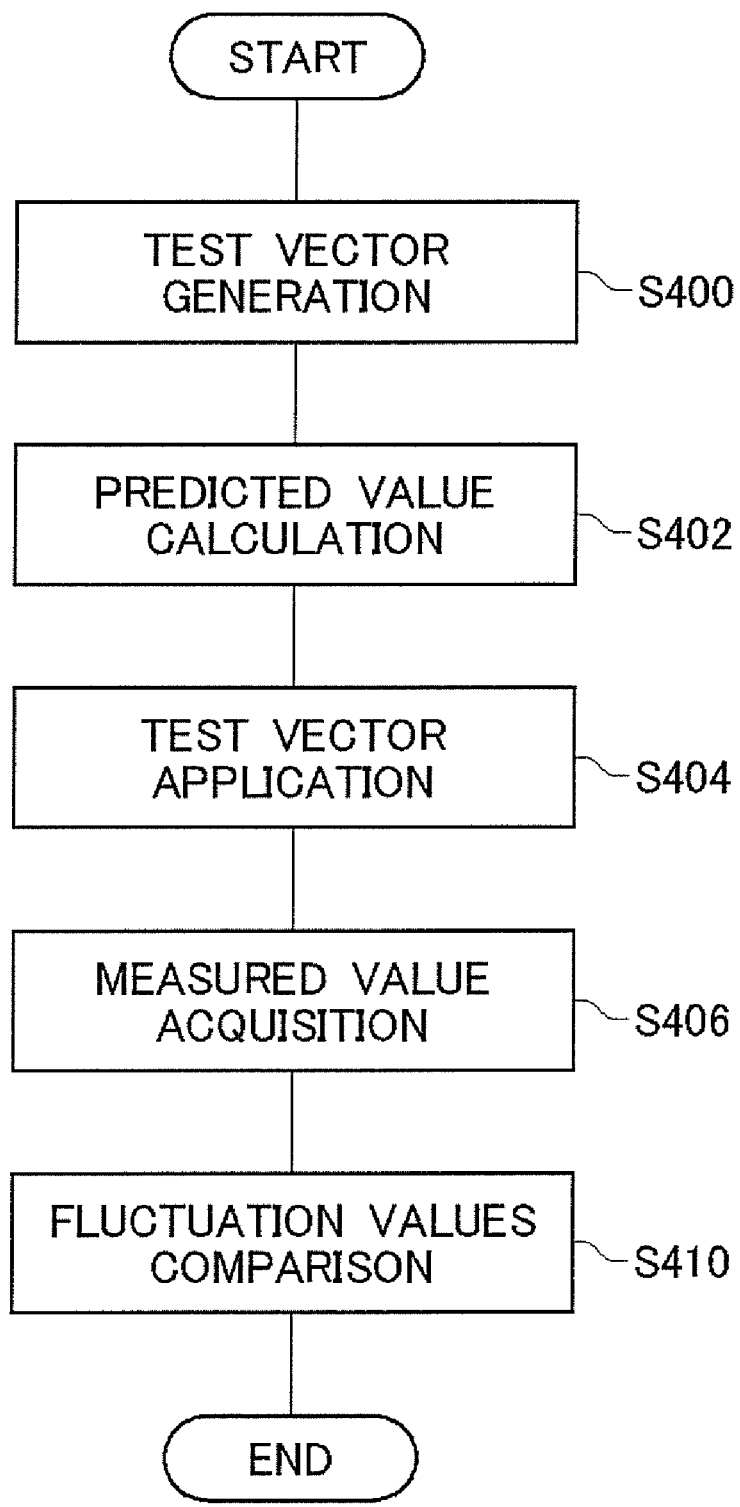
FIG. 6 is a flow chart showing an exemplary operation of the test apparatus 100 described in relation to FIG. 5.

FIG. 6 is a flow chart showing an exemplary operation of the test apparatus 100 described in relation to FIG. 5. In the present embodiment, the processes from S400 to S406 may be identical to the processes from S400 to S406 described in relation to FIG. 4. The test apparatus 100 of the present embodiment performs a process to compare the prediction variation value and the measurement variation value (S410) in place of the process of S408 of FIG. 4. This process can decrease the effect of characteristic variation in the device under test 300 caused by temperature variation or the like.

Figure 7:
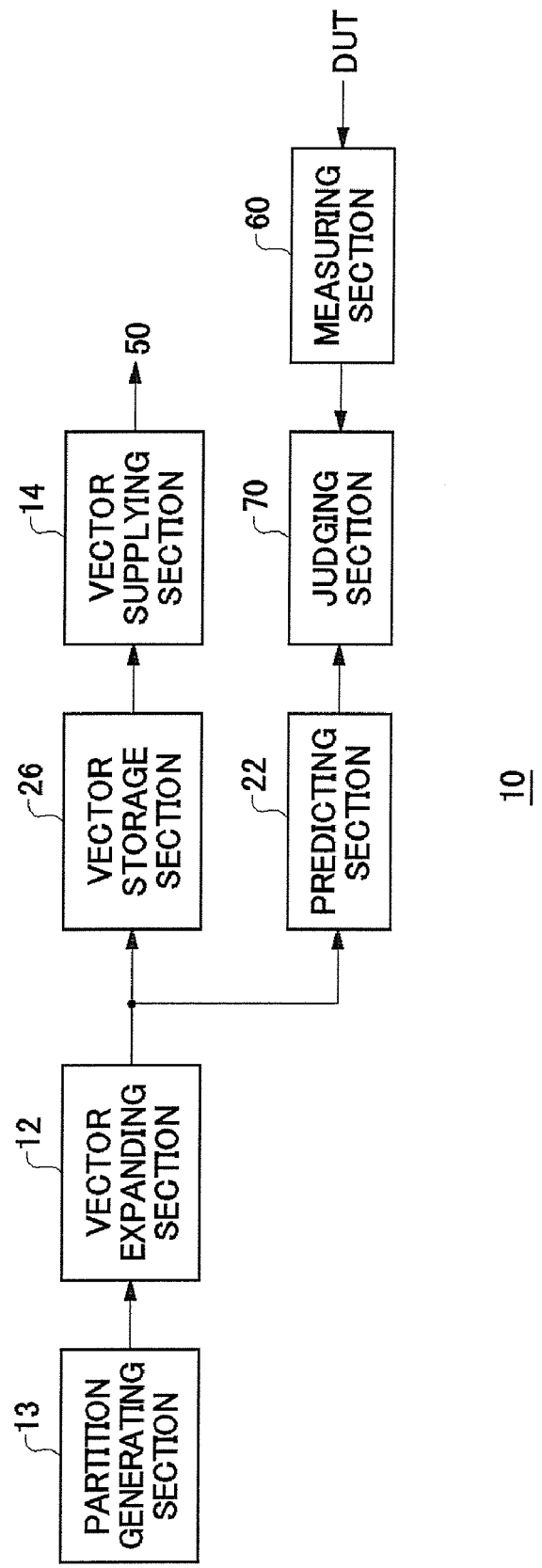
FIG. 7 shows another exemplary configuration of the test vector generating unit 10.

FIG. 7 shows another exemplary configuration of the test vector generating unit 10. The test vector generating unit 10 of the present embodiment is provided with a partition generating section 13 in addition to the configuration of the test vector generating unit 10 described in relation to FIG. 2. Elements other than the partition generating section 13 may have the same configuration and function as the elements described in FIGS. 2 to 6. The test vector generating unit 10 of the present embodiment partitions the device under test 300 into a plurality of circuit blocks, performs the processes described in relation to FIGS. 2 to 6 for each resulting circuit block, and judges pass/fail of each circuit block.

Generally, a variance occurs in the characteristic of the circuit elements due to processing variance or the like, even within the device under test 300. For example, a variance occurs in the characteristics of transistors formed in the device under test 300 when a variance occurs in the impurity concentration or the like in the substrate of the device under test 300.

Therefore, there is a possibility that the device under test 300 cannot be accurately tested due to the variances of the element characteristics in the device under test 300, even if the characteristic variance caused by the test vectors is suppressed as described in relation to FIGS. 1 to 6. The test vector generating unit 10 of the present embodiment partitions the device under test 300 into a plurality of circuit blocks and performs the processes described in relation to FIGS. 2 to 6 for each circuit block.

The variance for each circuit element in the measurement target increases when smaller feature sizes are considered. Since the test vector generating unit 10 of the present embodiment performs testing for each circuit block resulting from the partitioning of the device under test 300, the test vector generating unit 10 can decrease the effect of the characteristic variance of the circuit elements in order to accurately judge pass/fail of each circuit block.

The partition generating section 13 partitions the device under test 300 into a plurality of circuit blocks. For example, the partition generating section 13 extracts, as a circuit block, a region that can operate independently from other regions during testing of the device under test 300. Here, the region that can operate independently from other regions may be a region in which the logic states of the circuits can be arbitrarily changed even if the logic state of the circuits in other regions are fixed.

The partition generating section 13 may be provided in advance with connection information indicating the spacing between the circuit elements in the device under test 300. The partition generating section 13 may partition the device under test 300 into the plurality of circuit blocks by extracting independently operable regions based on the connection information.

The partition generating section 13 may be provided in advance with position information indicating the position of each circuit element in the device under test 300. The partition generating section 13 may partition the device under test 300 into the plurality of circuit blocks based on the position information. For example, the partition generating section 13 partitions the device under test 300 into a plurality of regions having identical areas, and extracts the circuit group included in each of these regions as one of the circuit blocks.

The vector expanding section 12 generates test vectors corresponding to each of these circuit blocks, and also generates test vectors corresponding to the other circuit blocks in which the logic patterns of the bits are fixed. In other words, the vector expanding section 12 generates a plurality of test vectors that sequentially change the logic state of the target circuit blocks, while keeping the logic states of the other circuit blocks fixed. The vector expanding section 12 of the present embodiment may fix the bits in the test vectors that do not correspond to the target circuit blocks to have predetermined logic values.

The vector storage section 26 and the predicting section 22 may be the same as the vector storage section 26 and the predicting section 22 described in relation to FIGS. 2 to 6. That is, the vector storage section 26 may store the pattern of each test vector. The predicting section 22 may calculate a predicted value or the like for each test vector. The predicting section 22 may store each test vector in association with the test vector number, the corresponding circuit block, the predicted value, the normalized predicted value, the prediction variation value, and the like. The vector supplying section 14 reads the test vector corresponding to the circuit block being tested from the vector storage section 26 and supplies the waveform shaping section 50 with this test vector.

The judging section 70 judges whether each circuit block is defective based on each measured value or the like acquired by the measuring section 60 for the circuit block. The predicting section 22 and the measuring section 60 may select a reference test vector for each circuit block. For example, the predicting section 22 and the measuring section 60 may set the reference vector of a circuit block to be a test vector that is determined in advance to cause the circuit block being tested to operate normally. With this configuration, the effect of the characteristic variation of the circuit elements can be decreased, so that the defectiveness of the device under test can be accurately judged.

When measuring the quiescent current IDDQ, the vector expanding section 12 may set each bit corresponding to other circuit blocks, in the test vectors corresponding to each target circuit block, to have a logic pattern that causes the current consumed by these other circuit blocks to be as small as possible. In this way, the test apparatus 100 can decrease the effect of other circuit blocks in order to accurately measure the quiescent current of the target circuit blocks. The vector expanding section 12 may perform a simulation to acquire the consumed current of the other circuit blocks when each test vector is used to operate these other circuit blocks.

Figure 8:
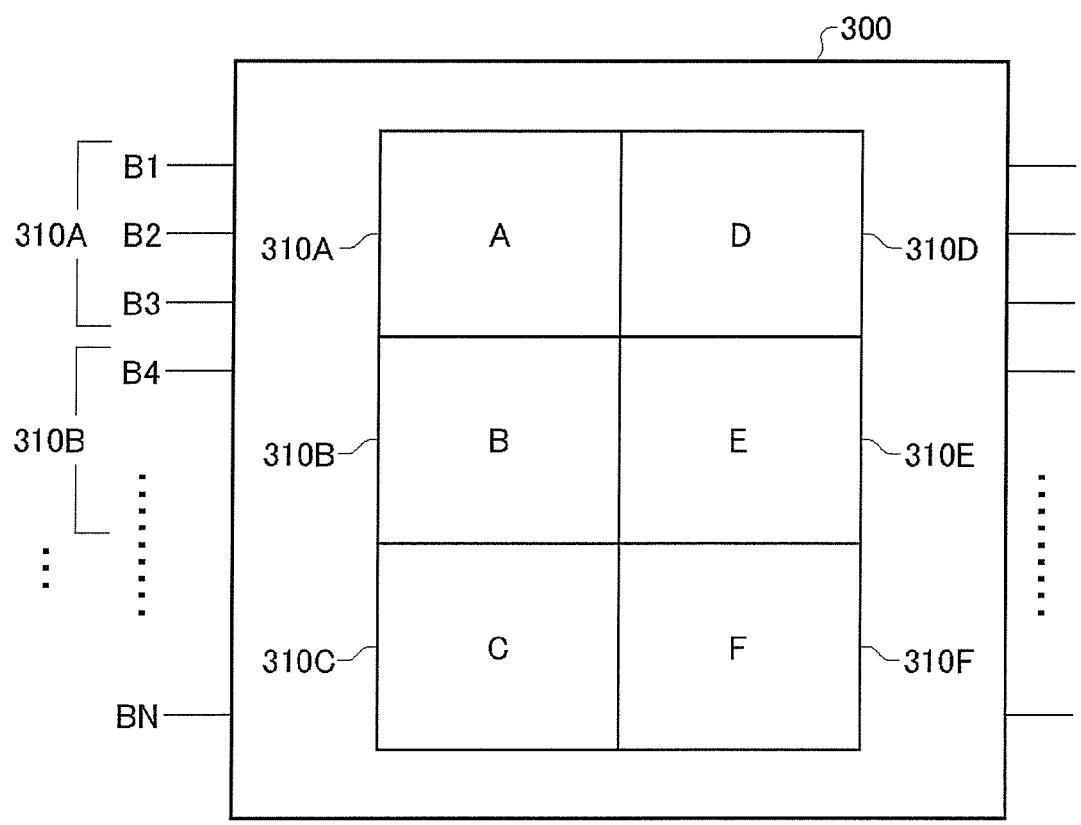
FIG. 8 shows an example of a plurality of circuit blocks 310.

FIG. 8 shows an example of a plurality of circuit blocks 310. The partition generating section 13 of the present embodiment partitions the device under test 300 into circuit blocks 310A to 310F. The vector expanding section 12 generates test vectors having N bits.

For example, if the bits B1 to B3 of a test vector correspond to the circuit block 310A, the vector expanding section 12 may generate the test vectors corresponding to the circuit block 310A by fixing the logic values of the bits B4 to BN and sequentially changing the logic values of the bits B1 to B3. The bits corresponding to the circuit blocks 310 may be the bits at which the logic state of the corresponding circuit block 310 transitions when the bit is changed.

In the same way, the vector expanding section 12 may sequentially generate the test vectors corresponding to the circuit block 310B by fixing the logic values of the bits other than the bits B4 to Bk corresponding to the circuit block 310B. By performing this process for each circuit block 310, a test vector group can be generated for each circuit block.

By performing the test described above for each circuit block, the component depending on the pattern of the test vector and the component depending on the variation in the circuit characteristics in the measurement result can be decreased.

Figure 9:
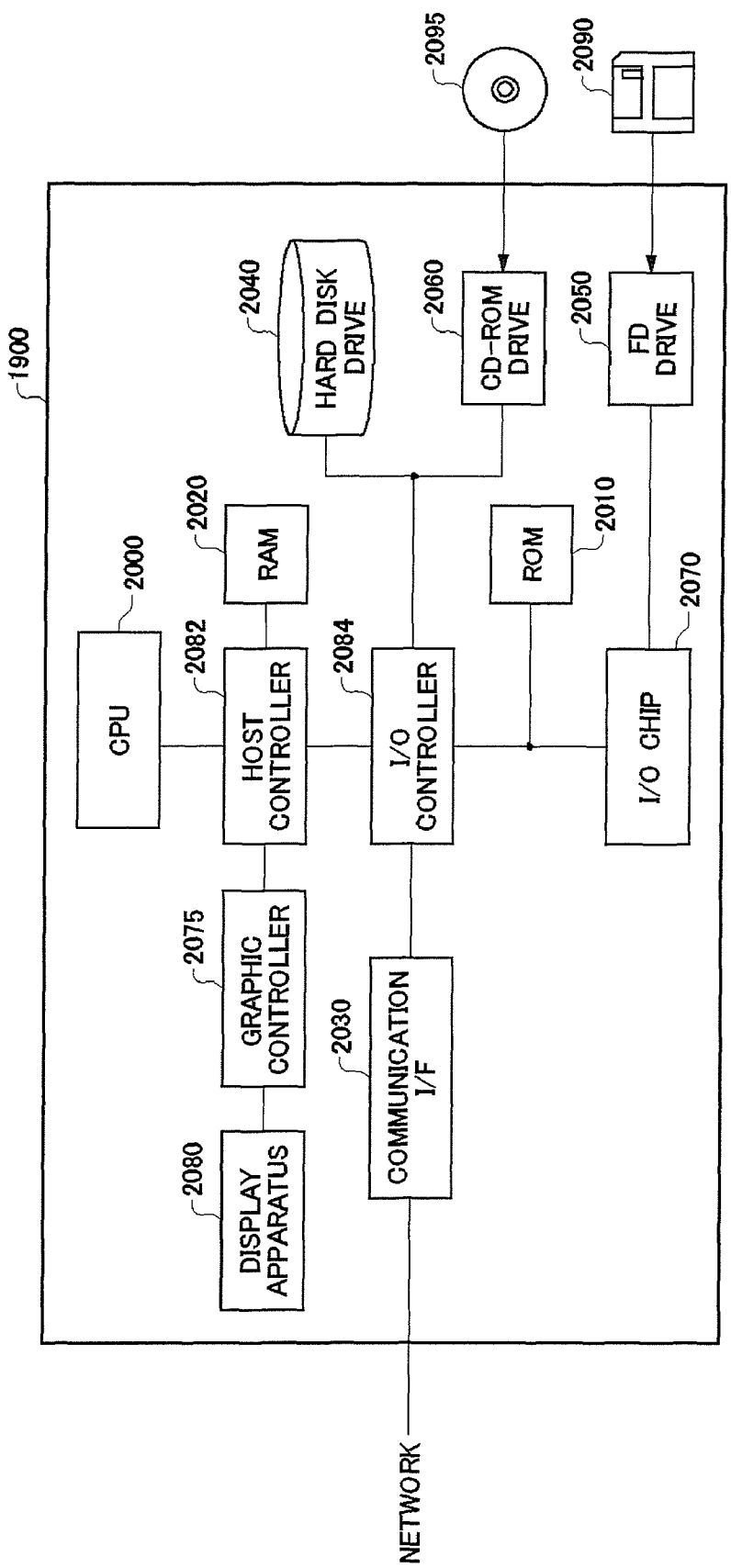
FIG. 9 shows an exemplary configuration of a computer 1900.

FIG. 9 shows an exemplary configuration of a computer 1900. The computer 1900 may function as the test vector generating unit 10 described in FIGS. 1 to 8, based on a program supplied thereto. For example, the computer 1900 may function as at least a portion of the partition generating section 13, the vector expanding section 12, the vector storage section 26, the predicting section 22, and the vector supplying section 14.

The computer 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a hard disk drive 2040, and a CD-ROM drive 2060, all of which are connected to the host controller 2082 by an I/O controller 2084; and a legacy input/output section including a ROM 2010, a flexible disk drive 2050, and an input/output chip 2070, all of which are connected to the I/O controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The I/O controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the I/O controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

These programs are installed in the computer 1900. The programs may prompt the CPU 2000 or the like to cause the computer 1900 to function as the test vector generating unit 10. For example, these programs may cause the CPU 2000 to function as the partition generating section 13, the vector expanding section 12, the predicting section 22, and the vector supplying section 14. These programs may cause the RAM 2020 to function as the vector storage section 26.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, by using the embodiments of the present invention, the degree to which the measured value of the leak current depends on the logic patterns of the test vectors can be decreased during testing of the device under test. Therefore, the device under test can be accurately tested.

What is claimed is:

1. A test apparatus that tests a device under test, comprising:
   a vector expanding section that sequentially generates a plurality of test vectors to be supplied to the device under test in a prescribed order;
   a predicting section that (i) calculates a predicted value for each test vector by simulating an operation of the device under test, the predicted value indicating a prescribed characteristic value of the device under test to be measured while the device under test is supplied with a test signal corresponding to the test vector, (ii) calculates normalized predicted values by dividing each predicted value by a predicted value corresponding to a reference test vector, and (iii) calculates, for each test vector, a prediction variation value indicating a variation amount between the normalized predicted value corresponding to the test vector and the normalized predicted value corresponding to the test vector supplied to the device under test immediately prior to the above test vector;
   a measuring section that (i) obtains a measured value for each test vector by measuring the prescribed characteristic value of the device under test each time the device under test is supplied with a test vector, (ii) calculates normalized measured values by dividing each measured value by a measured value corresponding to the reference vector, and (iii) calculates, for each test vector, a measurement variation value indicating a variation amount between the normalized measurement value corresponding to the test vector and the normalized measurement value corresponding to the test vector supplied to the device under test immediately prior to the above test vector; and a judging section that judges whether the device under test is defective based on a ratio between the prediction variation value and the measurement variation value corresponding to each test vector.

2. The test apparatus according to claim 1, wherein
the device under test includes a plurality of CMOS circuits that operate according to the test vectors,
the predicting section calculates a predicted value of a quiescent current in the device under test each time the device under test is supplied with a test signal corresponding to one of the test vectors, and
the measuring section obtains a measurement value of a quiescent current in the device under test each time the device under test is supplied with a test signal corresponding to one of the test vectors.

3. The test apparatus according to a claim 1, wherein
the device under test is partitioned into a plurality of circuit blocks, and
the predicting section and the measuring section select a reference test vector for each circuit block.

4. The test apparatus according to claim 3, wherein
the vector expanding section generates, as the test vector corresponding to each circuit block, a test vector in which a logic pattern of bits corresponding to an other circuit block is fixed.

5. The test apparatus according to claim 4, wherein
the vector expanding section generates, as the test vector corresponding to each circuit block, a test vector in which the bits corresponding to the other circuit block are fixed as a logic pattern that minimizes a current consumed by the other circuit block.

6. The test apparatus according to claim 5, further comprising
a partition generating section that partitions the device under test into a plurality of the circuit blocks, based on connection information about the circuit elements in the device under test that is provided to the partition generating section in advance.

7. A method for testing a device under test with a test apparatus, the method comprising:
sequentially generating, with a vector expanding section of the test apparatus, a plurality of test vectors to be supplied to the device under test in a prescribed order;
calculating, with a predicting section of the test apparatus, a predicted value for each test vector by simulating the operation of the device under test, the predicted value indicating a prescribed characteristic value of the device under test to be measured while the device under test is supplied with a test signal corresponding to the test vector;
calculating, with the predicting section of the test apparatus, normalized predicted values by dividing each predicted value by a predicted value corresponding to a reference test vector;
calculating, with the predicting section of the test apparatus, for each test vector, a prediction variation value indicating a variation amount between the normalized predicted value corresponding to the test vector and the normalized predicted value corresponding to the test vector supplied to the device under test immediately prior to the above test vector;
obtaining, with a measuring section of the test apparatus, a measured value for each test vector by measuring the prescribed characteristic value of the device under test each time the device under test is supplied with a test vector;
calculating, with the measuring section of the test apparatus, normalized measured values by dividing each measured value by a measured value corresponding to the reference vector;
calculating, with the measuring section of the test apparatus, for each test vector, a measurement variation value indicating a variation amount between the normalized measurement value corresponding to the test vector and the normalized measurement value corresponding to the test vector supplied to the device under test immediately prior to the above test vector; and
judging, with a judging section of the test apparatus, whether the device under test is defective based on a ratio between the prediction variation value and the measurement variation value corresponding to each test vector.

8. A non-transitory recording medium that stores a program that causes a computer to function as a test apparatus that tests a device under test, the program causing the computer to function as a test apparatus comprising:
a vector expanding section that sequentially generates a plurality of test vectors to be supplied to the device under test in a prescribed order;
a predicting section that (i) calculates a predicted value for each test vector by simulating the operation of the device under test, the predicted value indicating a prescribed characteristic value of the device under test to be measured while the device under test is supplied with a test signal corresponding to the test vector, (ii) calculates normalized predicted values by dividing each predicted value by a predicted value corresponding to a reference test vector, and (iii) calculates, for each test vector, a prediction variation value indicating a variation amount between the normalized predicted value corresponding to the test vector and the normalized predicted value corresponding to the test vector supplied to the device under test immediately prior to the above test vector;
a measuring section that (i) obtains a measured value for each test vector by measuring the prescribed characteristic value of the device under test each time the device under test is supplied with a test vector, (ii) calculates normalized measured values by dividing each measured value by a measured value corresponding to the reference vector, and (iii) calculates, for each test vector, a measurement variation value indicating a variation amount between the normalized measurement value corresponding to the test vector and the normalized measurement value corresponding to the test vector supplied to the device under test immediately prior to the above test vector; and
a judging section that judges whether the device under test is defective based on a ratio between the prediction variation value and the measurement variation value corresponding to each test vector.

* * * * *